(12) United States Patent
Nam et al.

(10) Patent No.: US 6,742,561 B2
(45) Date of Patent: Jun. 1, 2004

(54) APPARATUS FOR DIE BONDING

(75) Inventors: Shi Baek Nam, Incheon (KR); Dong Kuk Kim, Cheonan (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/116,786

(22) Filed: Apr. 4, 2002

(65) Prior Publication Data

US 2002/0109217 A1 Aug. 15, 2002

Related U.S. Application Data

(62) Division of application No. 09/359,961, filed on Jul. 22, 1999, now abandoned.

(30) Foreign Application Priority Data

Aug. 26, 1998 (KR) .......................................... 998-34629

(51) Int. Cl.[7] .............................................. H01L 21/44
(52) U.S. Cl. ...................... 156/521; 156/519; 156/559; 156/570; 156/300; 156/265; 156/302; 156/303; 414/941; 414/751.1; 414/737; 438/111; 438/118; 438/123; 29/25.01; 29/740; 29/827
(58) Field of Search .................................. 438/111, 118, 438/123; 156/303, 265, 300, 302, 519, 521, 560, 559, 566, 569, 570, 571, 572; 29/25.01, 740, 827; 414/941, 752.1, 737

(56) References Cited

U.S. PATENT DOCUMENTS 5,653,575 A  *  8/1997  Park et al. ................... 414/797
5,765,277 A  *  6/1998  Jin et al. ....................... 29/743
6,012,502 A  *  1/2000  VanNortwick et al. ....... 156/518

* cited by examiner

Primary Examiner—Linda Gray
(74) Attorney, Agent, or Firm—Harness, Dickey & Pierce P.L.C.

(57) ABSTRACT

The present invention provides an apparatus for bonding a semiconductor chip to substrate using a non-conductive adhesive tape. The non-conductive adhesive tape may be a polyimide tape. The apparatus may include a tape provider having a reel on which the non-adhesive tape may be spooled, rollers, and a tape cutter which cuts the tape to a suitable size. A tape holder and a tape presser may also be provided to hold the tape in place while the tape cutter cuts the tape. A tape pick-up tool may be provided to transfer the cut tape to a die bonding area on the substrate. The tape holder and the tape pick-up tool may include a suction opening for providing a suction force. The apparatus may further include a die pick up tool for transferring a semiconductor chip from a semiconductor chip provider to the adhesive tape affixed to the substrate.

8 Claims, 5 Drawing Sheets

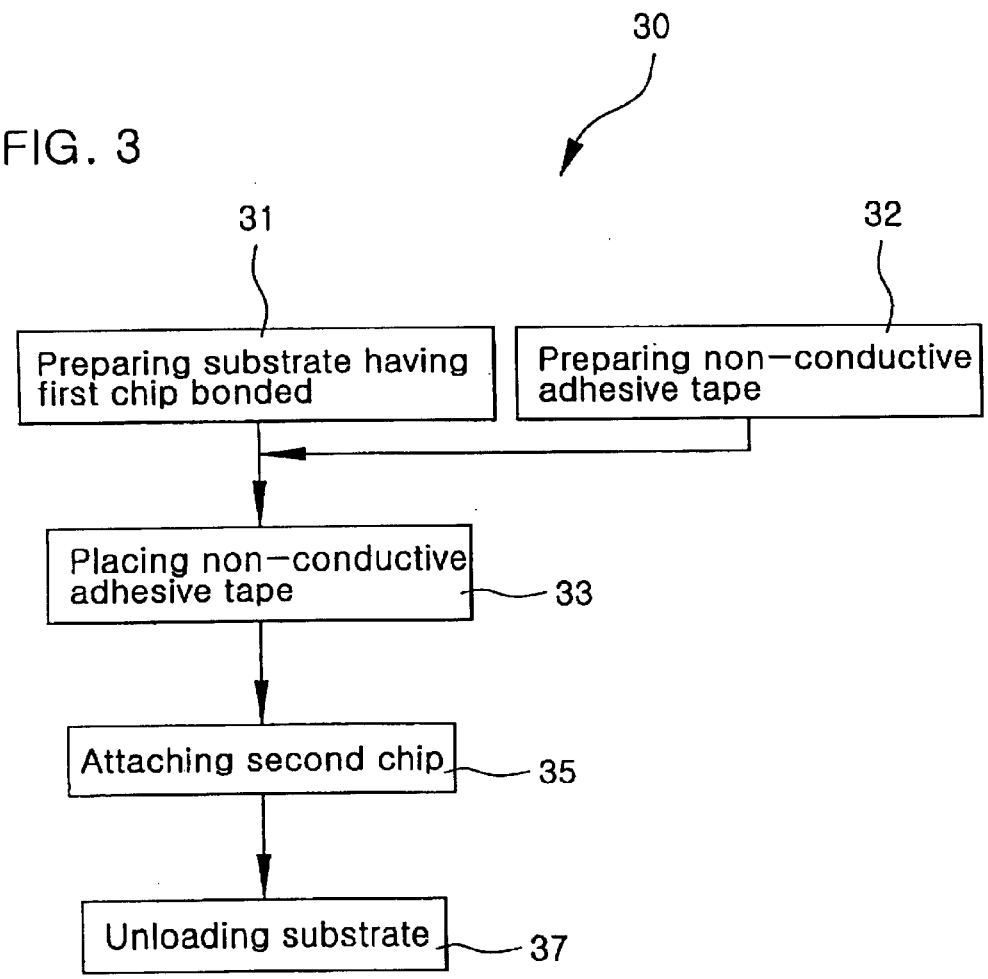

APPARATUS FOR DIE BONDING

CROSS-REFERENCE TO RELATED APPLICATION

This application is a divisional of U.S. patent application Ser. No. 09/359,961, entitled "Semiconductor Package Including a Non-Conductive Adhesive Tape, and Method and Apparatus for Die Bonding," filed Jul. 22, 1999, now abandoned.

BACKGROUND OF THE INVENTION

1. Field of the Invention

The present invention relates to a semiconductor package including a non-conductive adhesive tape, and a manufacturing method and apparatus for die bonding of the package.

2. Description of the Related Arts

In manufacture of semiconductor devices, die bonding refers to a step of attaching a semiconductor die to a substrate such as a lead frame or a printed circuit board using an adhesive. A typical adhesive used in the die bonding is Ag-epoxy which is electrically conductive. However, in a specific case, an electrically insulating (non-conductive) adhesive may be used for die bonding. For example, where multiple dies are bonded to a single substrate, a non-conductive adhesive is used for electrically insulating each individual die from others.

Most non-conductive adhesives are of a liquid type. The liquid non-conductive adhesive spreads out when the semiconductor chip is pressed for bonding, and thus the adhesive layer is very thin after the bonding, and the insulating capacity of the adhesive layer is correspondingly poor. In addition, liquid type adhesives are prone to produce voids within the adhesive layer. The voids within the adhesive layer provide a source of package cracking, such as a delamination between the adhesive layer and the substrate. Moreover, overspreading of the liquid adhesive onto the chip can cause a problem in a subsequent wire bonding.

To avoid the low insulating capability of the liquid non-conductive adhesive, an insulating film, which is made of an insulating material such as a ceramic or an epoxy, can be inserted in the adhesive layer. While the insertion of an insulating film can effectively increase the insulating capability of the adhesive layer, the die bonding process becomes complicated resulting in a manufacturing cost increase.

FIG. 1 illustrates a configuration of a semiconductor package 10 using an insulating film 15. In FIG. 1, a first semiconductor chip 13 is bonded to a lead frame 11 by a conductive adhesive 12, and a second semiconductor chip 17 is bonded to lead frame 11 using insulating film 15 so that first chip 13 is electrically insulated from second chip 17. To bond first chip 13 lead frame 11, a conductive liquid adhesive 12 is dispensed on lead frame 11, first chip 13 is placed on and pressed into dispensed adhesive 12, and adhesive 12 is cured. In contrast, die bonding of second chip 17 requires several steps. Initially, a non-conductive liquid adhesive 14 is dispensed on lead frame 11, insulating film 15 is placed on and pressed into dispensed non-conductive liquid adhesive 14, and adhesive 14 is cured. Then, an non-conductive liquid adhesive 16 is dispensed on insulating film 15, second chip 17 is placed on and pressed into the dispensed adhesive 16, and adhesive 16 is cured.

As described above, the die bonding method using an insulating film requires additional process steps for inserting the insulating film. In addition, since the method uses liquid adhesive twice, the problems associated with liquid adhesives may be doubled.

SUMMARY OF THE INVENTION

A semiconductor package in accordance with an embodiment of the present invention includes a first semiconductor chip which is bonded to a substrate, such as a lead frame, by a conductive adhesive, and a second semiconductor chip which is bonded to the substrate by a non-conductive adhesive tape. In one embodiment, the non-conductive adhesive tape includes a polyimide tape and adhesive layers on top and bottom surfaces of the polyimide tape. The polyimide tape is typically about 20 to 60 $\mu$m thick, and each of the adhesive layers is typically about 10 to 30 $\mu$m thick. A non-conductive adhesive tape with this construction has a dielectric strength (or breakdown voltage) of more than 2,500 V.

Another embodiment of the present invention provides a die bonding method. The method includes preparing a substrate on which a first semiconductor chip is bonded by a conductive adhesive, preparing a non-conductive adhesive tape, attaching the non-conductive adhesive tape to the substrate, and bonding a second semiconductor chip to the non-conductive adhesive tape. Preparing the non-conductive adhesive tape includes spooling a base non-conductive adhesive tape onto a reel, and cutting the base non-conductive adhesive tape, which is spooled off the reel, to a size for bonding the second chip. When attaching the conductive adhesive tape and the second chip, a temperature of approximately 150° C. to 500° C. is applied to the substrate, and a pressure of approximately 100 gf/mm$^2$ (grams force/millimeter) to 600 gf/mm$^2$ is applied to the second chip.

The invention also provides an apparatus for die bonding. The apparatus includes a stacker for loading a substrate, a transferring means for transferring the substrate, a tape provider that provides adhesive tape for bonding a second semiconductor chip to the substrate, a tape pick-up tool which transports the adhesive tape from the tape provider to the substrate, a chip provider in which the chip is placed, and a die pick-up tool which picks up the chip from the chip provider and bonds the chip to the adhesive tape on the substrate. The tape provider of the apparatus includes a reel to which the adhesive tape is spooled, a tape cutter for cutting the adhesive tape to a size for the chip, a roller for providing the adhesive tape to the tape cutter, and a tape holder for holding the adhesive tape during the cutting.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which:

FIG. 2, which includes parts labeled

FIG. 3 is a flowchart of a method for die bonding in accordance with an embodiment of the present invention;

DETAILED DESCRIPTION OF THE PREFERRED EMBODIMENTS

Figure 1:
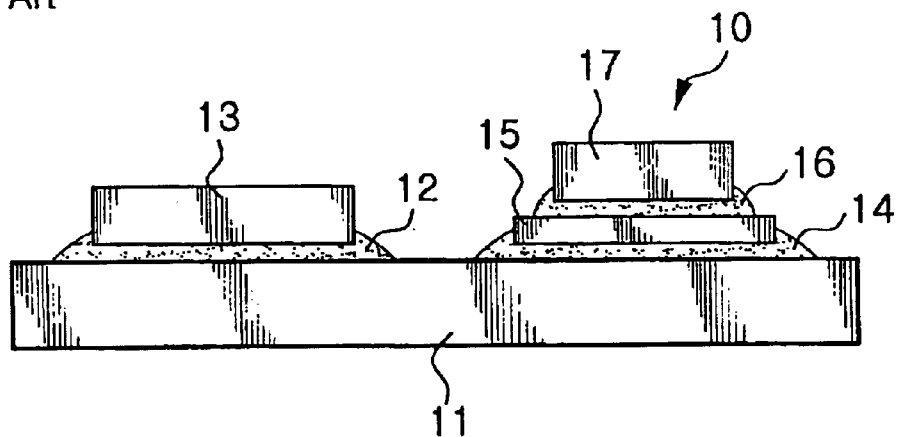
FIG. 1 is a cross-sectional view of a conventional semiconductor package.
Figure 2A:
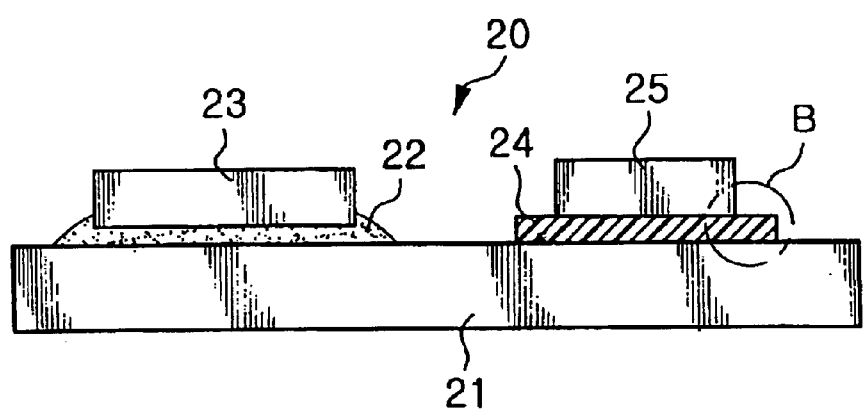
FIG. 2A and FIG. 2B, is a cross-sectional view of a semiconductor package in accordance with an embodiment of the present invention.
Figure 2B:
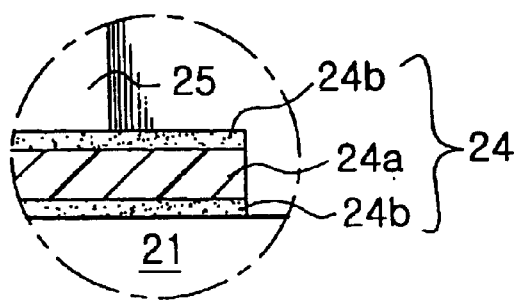

FIG. 2 is a cross-sectional view of a semiconductor package 20 according to an embodiment of the present invention. Semiconductor package 20 is a power-switching device and uses a lead frame 21 as a substrate. Semiconductor device 20 includes first and second semiconductor chips 23 and 25 which are bonded to lead frame 21. First chip 23 is a transistor chip such as a MOSFET (MOS-type Field Effect Transistor), and second chip 25 is a control chip. After die bonding, first chip 23 and second chip 25 are electrically connected to respective inner leads (not shown) of lead frame 21 by metal wires (not shown), and encapsulated with an encapsulant (not shown) such as an epoxy molding compound.

Lead frame 21 is made of an iron-nickel (Fe—Ni) alloy or a copper (Cu) alloy and serves as a drain of first chip 23, the transistor chip. Therefore, an adhesive 22 for bonding first chip 23 to lead frame 21 is electrically conductive. However, second chip 25 should be insulated from lead frame 21, and a non-conductive adhesive tape 24 bonds second chip 25 to lead frame 21. Non-conductive tape 24 includes an insulating tape 24a, such as a polyimide tape, and adhesive layers 24b on top and bottom surfaces of insulating tape 24a. Insulating tape 24a is about 20 to 60 $\mu$m thick, and each adhesive layer 24b is about 10 to 30 $\mu$m thick. Non-conductive adhesive tape 24 with the construction described above has a dielectric strength (also referred to as a 'breakdown voltage') of more than about 2,500 V.

A non-conductive adhesive tape in accordance with the above embodiment of the present invention includes a polyimide central tape and polyimide adhesive layers which are respectively formed on the top and bottom surfaces of the polyimide central tape, that is, a total of three layers. Alternatively, a non-conductive adhesive tape of the invention may have only one layer, that is, a polyimide adhesive layer without any layer on its top or bottom surface. In this case, a non-conductive adhesive tape is about 10 to 30 $\mu$m thick and has a dielectric strength of about 1,000 V.

Non-conductive adhesive tape 24 provides reliable insulation by avoiding the defects associated with non-conductive liquid adhesives. In particular, tape 24 reduces or eliminates voids and delamination between a chip and a lead frame.

Figure 4:
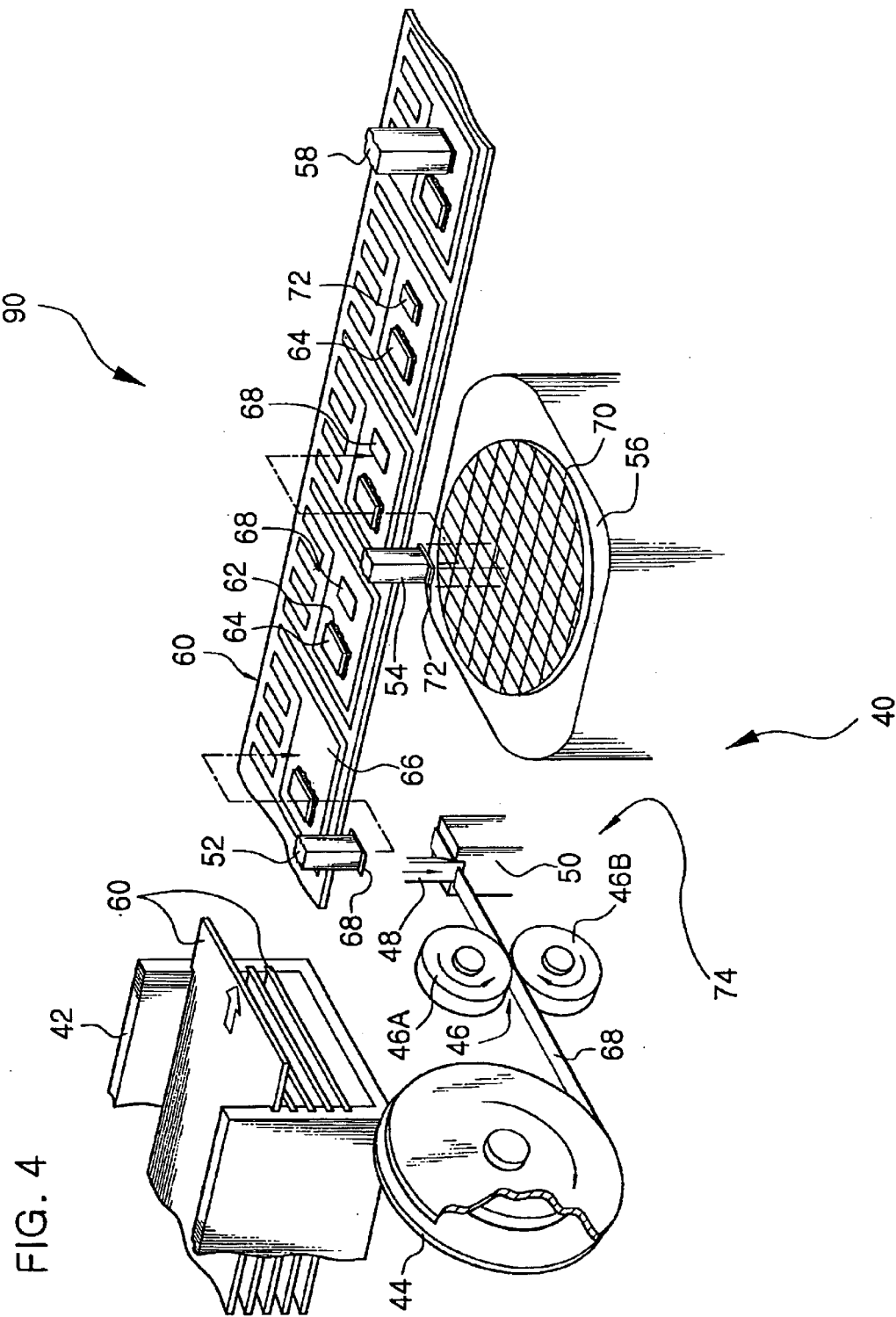
FIG. 4 is a perspective view of an apparatus for die bonding in accordance with still another embodiment of the present invention.

Referring to FIGS. 3 and 4, a method 30 and an apparatus 40 for die bonding using a non-conductive adhesive tape are described. Method 30 begins in step 31 with preparing a substrate, e.g., a lead frame 60, on which a first semiconductor chip 64 is bonded. Typically, a number of lead frames 60 are loaded in a magazine 42. Instead of lead frame 60, a printed circuit board or tape wiring board can be used as the substrate. A transferring means (not shown), such as a transfer rail, transports lead frames 60 from magazine 42 to a die bonding station 90 of apparatus 40 by moving a set distance per transferring motion.

In addition to lead frame 60, a non-conductive adhesive tape 68, which has the structure of adhesive tape 24 of FIG. 2, is provided to apparatus 40 in step 32. While the transferring means sends lead frame 60 to die bonding station 90, a tape provider 74 provides non-conductive adhesive tape 68 to die bonding station 90. Tape provider 74 includes a reel 44 on which non-conductive adhesive tape 68 is spooled, and a tape cutter 48 for cuffing insulating adhesive tape 68 to a size for bonding a second semiconductor chip on a bonding pad 66 of lead frame 60. Tape provider 74 further includes a set of rollers 46 having upper and lower rollers 46A and 46B that provide non-conductive adhesive tape 68 to tape cutter 48, and a tape holder 50 that holds non-conductive adhesive tape 68 by a suction force. As shown in FIGS. 5A to 5D, tape provider 74 may further include a tape presser 49.

Figure 5A:
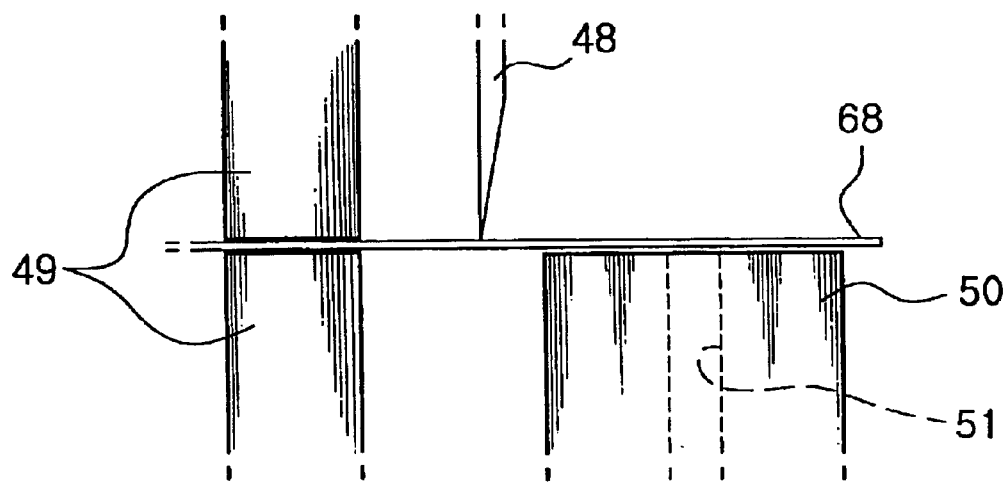
FIG. 5A is a cross-sectional view of a tape provider of the apparatus of FIG. 4 depicting an aligning of a tape cutter on a base non-conductive adhesive tape.
Figure 5B:
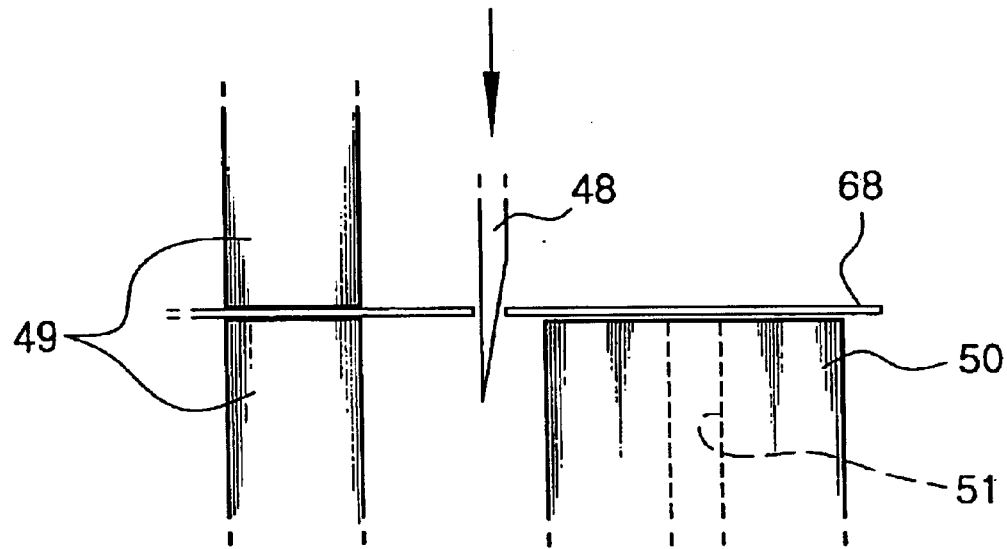
FIG. 5B is a cross-sectional view of a tape provider of the apparatus of FIG. 4 depicting a cutting of the base non-conductive adhesive tape with a cutter.

In step 33, upper and lower rollers 46A and 46B provide non-conductive adhesive tape 68 from reel 44 to tape cutter 48, and tape cutter 48 cuts adhesive tape 68. With reference to FIGS. 5A and 5B, which illustrate the cutting of adhesive tape 68, rollers 46A and 46B move adhesive tape 68 toward tape cutter 48 by a distance equal to the proper length for the die bonding of second chip 72. Tape presser 49 presses tape 68, and tape holder 50 holds tape 68, so that adhesive tape 68 is fixed. Tape presser 49 holds adhesive tape 68 by pressing a top and bottom surfaces of adhesive tape 68, and tape holder 50 applies suction to a bottom surface of adhesive tape 68 to hold adhesive tape 68 in place. A vacuum suction hole 51 applies the suction to adhesive tape 68. While tape 68 is held, cutter 48 cuts tape 68. The size of piece of adhesive tape 68 can be controlled by changing the distance that rollers 46A and 46B move tape 68 and changing the width of adhesive tape 68.

Figure 5C:
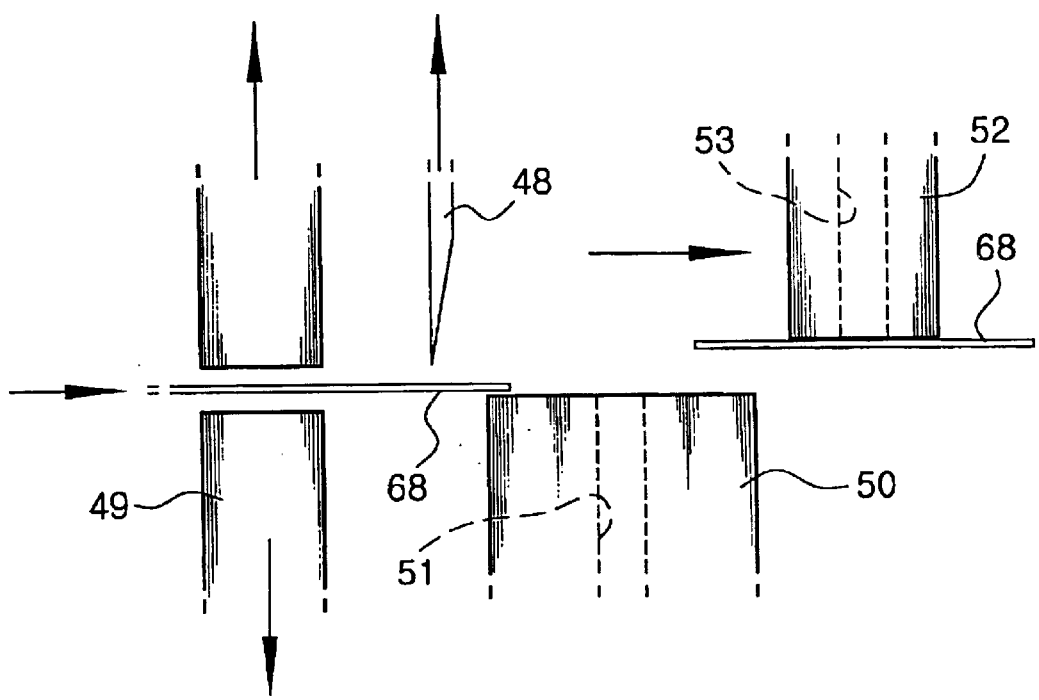
FIG. 5C is a cross-sectional view of a tape provider of the apparatus of FIG. 4 depicting a transferring of a non-conductive adhesive tape with a tape pick-up tool.
Figure 5D:
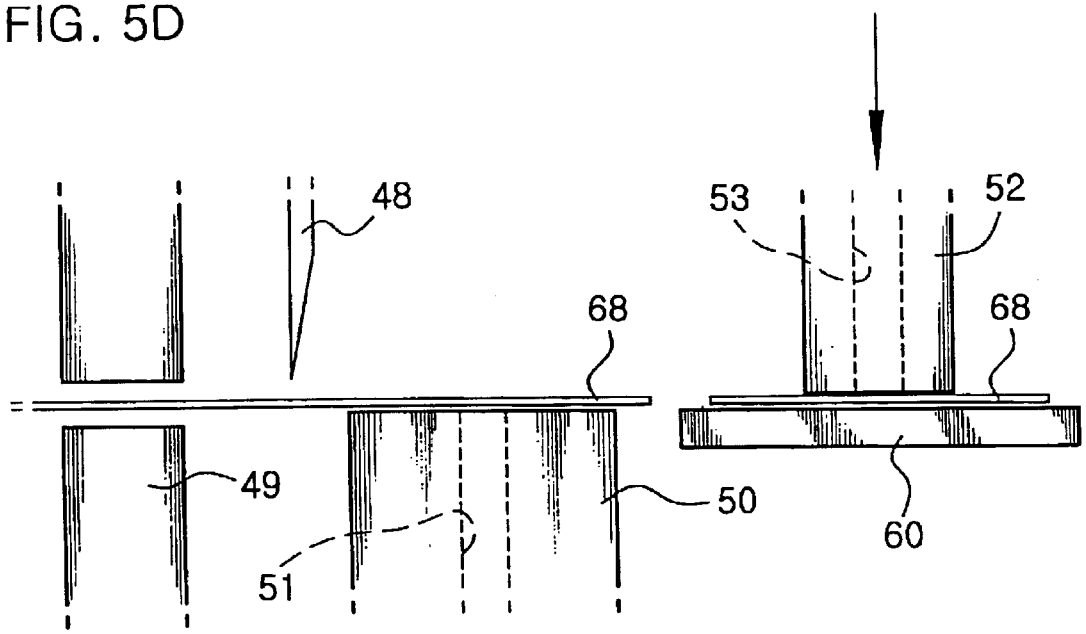
FIG. 5D is a cross-sectional view of a tape provider of the apparatus of FIG. 4 depicting an attaching of the non-conductive adhesive tape to a substrate.

After cutting adhesive tape 68, a tape pick-up tool 52 places adhesive tape 68 that was cut to lead frame 60 (step 33). As shown in FIG. 5C, tape pick-up tool 52 applies a suction force through a vacuum suction hole 53 to pick adhesive tape 68 up from tape holder 50 of tape provider 74 and then transports adhesive tape 68 to die bonding station 90 where adhesive tape 68 will be bonded to die pad 66 of lead frame 60, and second chip 72 will be bonded to die pad 66 through adhesive tape 68. Then, as shown in FIG. 5D, tape pick-up tool 52 places adhesive tape 68 on die pad 66 of lead frame 60. When tape pick-up tool 52 picks up tape adhesive 68, the suction force applied through vacuum suction hole 51 of tape holder 50 is released.

After adhesive tape 68 is placed on die pad 66 of lead frame 60, step 35 attaches second chip 72 to die pad 66 through adhesive tape 68. A die pick-up tool 54 picks up second chip 72 from a chip provider, such as a wafer table 56, and places second chip 72 on adhesive tape 68. Then, a presser 58 applies a pressure (bonding pressure) on second chip 72 to attach second chip 72 to die pad 66. In addition to the pressure, heat can be applied to die pad 66. That is, in die bonding station 90, lead frame 60 is maintained at an elevated temperature (bonding temperature) so that adhesive layer of adhesive tape 68 bonds to die pad 66 and second chip 72. A typical bonding temperature and pressure are 150° C. to 500° C. and 100 gf/mm$^2$ to 600 gf/mm$^2$.

After attaching the second chip, step 37 unloads lead frame 60 from the transferring means to an unloader (not shown). While magazine 42 is positioned at a beginning end of the transferring means, e.g., transferring rail, the unloader is positioned at the other end of the transferring means.

As described above, the present invention provides a semiconductor package including a non-conductive adhesive tape. The use of the non-conductive adhesive tape provides a good electrical insulation between two chips bonded on the same lead frame. The tape has a dielectric strength of 2,500 V or more. Moreover, the use of the tape prevents the defects associated with non-conductive liquid adhesives, such as voids and a delamination between a chip and a lead frame, and thus results in a semiconductor package with a good reliability. The die bonding method using the non-conductive adhesive tape in accordance with the present invention is simpler than a conventional die bonding method using a liquid adhesive and insulating film. Therefore, the die bonding requires less time and is less expensive.

Although specific embodiments of the present invention have been described in detail hereinabove, it should be clearly understood that many variations and/or modifications of the basic inventive concepts herein taught which may appear to those skilled in the art still fall within the spirit and scope of the present invention as defined in the appended claims.

What is claimed is:

1. An apparatus for bonding a semiconductor chip to a substrate comprising:

a stacker in which a substrate is loaded;

a tape provider which provides an adhesive tape for bonding the semiconductor chip to the substrate;

a tape pick-up tool which adheres to a top surface of a piece of the adhesive tape, removes the piece of adhesive tape from the tape provider and transports the piece of the adhesive tape from the tape provider to a bonding pad of the substrate, wherein the substrate is offset from the tape provider in at least a lateral direction;

a semiconductor chip provider in which the semiconductor chip is contained;

a die pick-up tool which transports the semiconductor chip from the semiconductor chip provider; and a presser which presses the semiconductor chip placed on the piece of adhesive tape to bond the semiconductor chip to the substrate.

2. The apparatus of claim 1, wherein the tape provider comprises:

a reel on which the adhesive tape is spooled;

a tape holder for receiving a length of adhesive tape from the reel and applying a vacuum to a back surface of the adhesive tape; and a tape cutter moveable relative to the tape holder for cutting the adhesive tape to produce a piece of adhesive tape sized for bonding the semiconductor chip to the substrate.

3. The apparatus of claim 2, wherein the tape provider further comprises:

a set of rollers for advancing the adhesive tape to the tape cutter, the adhesive tape being placed between the rollers.

4. The apparatus of claim 1, further comprising:

a transferring member for transporting the substrate a distance in one transferring motion.

5. The apparatus of claim 1, wherein the adhesive tape is a non-conductive polyimide tape.

6. The apparatus of claim 1, wherein the adhesive tape is a non-conductive tape having a polyimide central layer with adhesive layers on top and bottom surfaces thereof.

7. The apparatus of claim 1, further comprising:

a tape presser for pressing the adhesive tape and holding the adhesive tape while the adhesive tape is being cut.

8. The apparatus of claim 1, wherein the tape pick-up tool includes a vacuum suction opening through which a vacuum suction force is applied to adhere the tape pick-up tool to a top surface of the piece of adhesive tape.

* * * * *